United States Patent
Ho et al.

(10) Patent No.: US 9,222,960 B2
(45) Date of Patent: Dec. 29, 2015

(54) ELECTRICAL TEST PLATFORM WITH ORGANIZED ELECTRICAL WIRING

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventors: Ten-Chen Ho, New Taipei (TW); Xiao-Lian He, Shenzhen (CN); Wei Zhou, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 178 days.

(21) Appl. No.: 14/141,448

(22) Filed: Dec. 27, 2013

(65) Prior Publication Data

US 2015/0137846 A1    May 21, 2015

(30) Foreign Application Priority Data

Nov. 20, 2013 (CN) .......................... 2013 1 0584964

(51) Int. Cl.
*G01R 31/00* (2006.01)
*G01R 1/04* (2006.01)

(52) U.S. Cl.
CPC ...................................... *G01R 1/0408* (2013.01)

(58) Field of Classification Search
CPC ............ G01R 1/04; G08B 21/18; H05K 7/00
USPC ..................... 324/750.25, 756.01; 361/679.01
See application file for complete search history.

(56) References Cited

U.S. PATENT DOCUMENTS

2014/0022712 A1 *   1/2014   HO .......................... 361/679.01

* cited by examiner

*Primary Examiner* — Arleen M Vazquez
*Assistant Examiner* — Steven Yeninas
(74) *Attorney, Agent, or Firm* — Novak Druce Connolly Bove + Quigg LLP

(57) ABSTRACT

A test platform for devices requiring electromagnetic interference testing includes a base, a supporting pole perpendicularly mounted on the base, a supporting member rotatably supported on the supporting pole, and a number of conductive apparatus mounted to the supporting pole. The supporting member includes a power socket. Each conductive apparatus includes a tank fitted about the supporting pole, conductive liquid received in the tank, first cables, and a second cable. Each tank defines an annular slide slot surrounding the supporting pole. First ends of the first cables are connected the power socket, second ends of the first cables are extended through the slide slots and electrically coupled to the conductive liquid. A first end of the second cable is electrically coupled to the conductive liquid, and a second end of the second cable is electrically coupled to an uninterrupted power supply.

15 Claims, 3 Drawing Sheets

ELECTRICAL TEST PLATFORM WITH ORGANIZED ELECTRICAL WIRING

BACKGROUND

1. Technical Field

The present disclosure relates to a test platform for electrical tests.

2. Description of Related Art

Electronic devices undergoing electromagnetic interference (EMI) tests may be placed on a round stage. The stage includes a plurality of wheels capable of rolling along a rail, so that the stage can be rotated 360 degrees. A power socket is mounted on the stage to supply power for the items. A cable of the power socket is connected to a power source. When the stage is rotated several times, the cable of the power socket gets tangled, and even damaged.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean "at least one."

Figure 1:
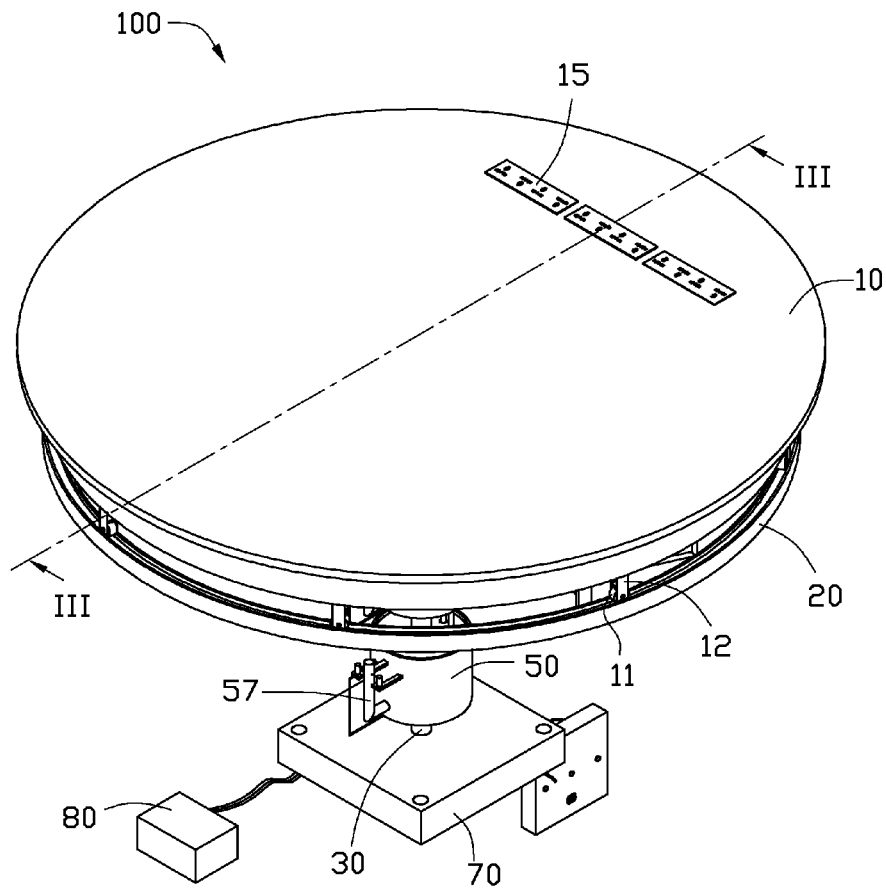
FIG. 1 is an isometric view of an embodiment of a test platform.
Figure 2:
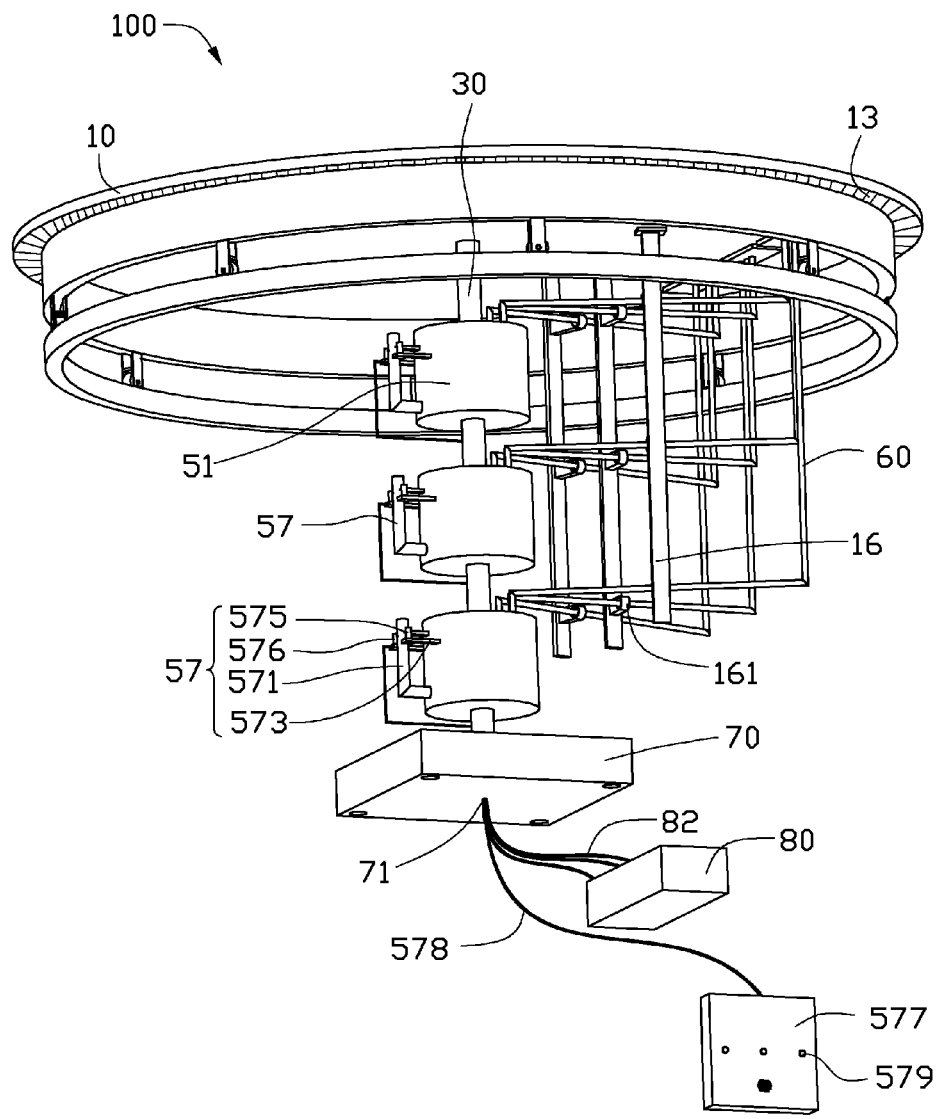
FIG. 2 is another perspective of view of the test platform of FIG. 1.

FIGS. 1 and 2 show an exemplary embodiment of a test platform 100 to support an electronic device undergoing electromagnetic interference (EMI) test. The test platform 100 includes a base 70, a hollow supporting pole 30 perpendicularly extending up from the base 70, a round supporting member 10 rotatably connected on a top of the supporting pole 30, an annular slide rail 20 located below the supporting member 10, and three conductive apparatus 50 positioned on the supporting pole 30 and between the supporting member 10 and the base 70.

A plurality of pairs of connection poles 12 extends down from the supporting member 10, and a wheel 11 is rotatably mounted between lower portions of two connection poles 12 of each pair of connection poles 12. The wheels 11 rest on the slide rail 20 and can roll along the slide rail 20, to allow rotation of the supporting member 10. Three power sockets 15 are mounted to the supporting member 10, and exposed through a top of the supporting member 10. Three brackets 16 extend down from the supporting member 10. Each bracket 16 includes three hooks 161 arranged along a lengthwise direction of the bracket 16, for positioning cables.

Figure 3:
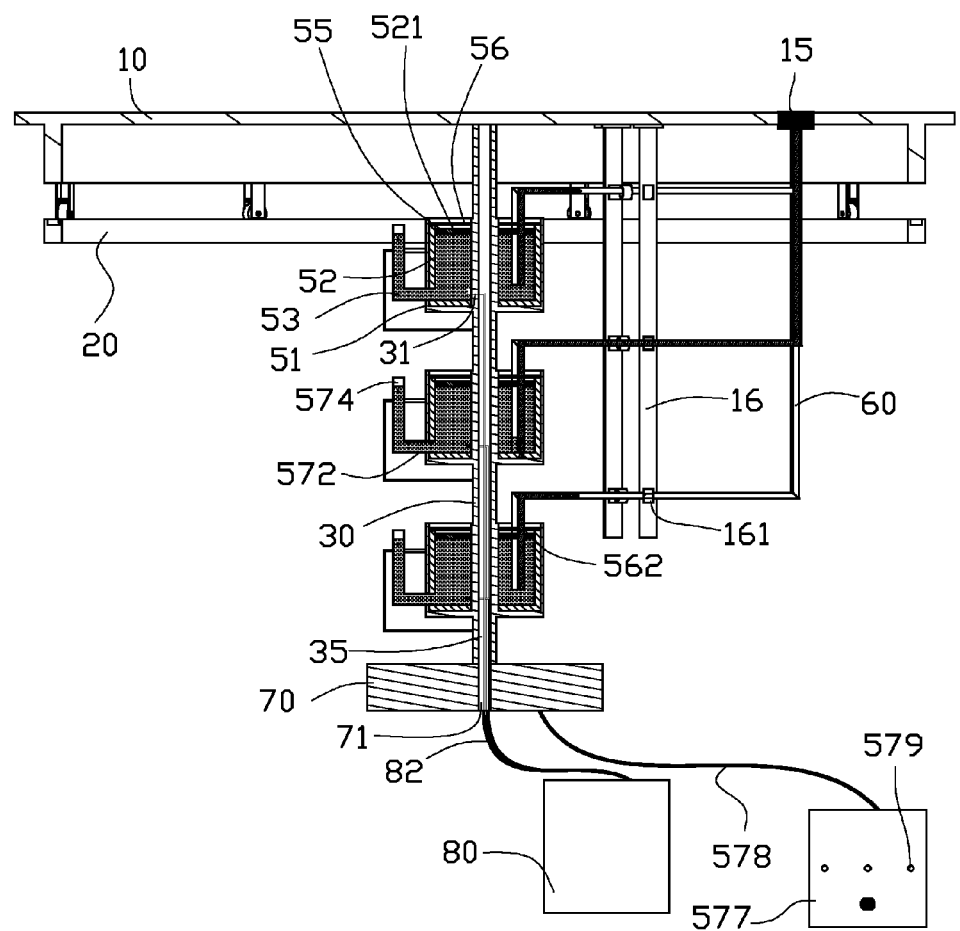
FIG. 3 is a sectional view of FIG. 1, taken along the line III-III.

FIG. 3 shows the sectional view of the test platform 100. A bottom end of the supporting pole 30 is mounted on the base 70, and the top end of the supporting pole 30 is rotatably connected to a middle of a bottom surface of the supporting member 10. The supporting pole 30 axially defines a through slot 35. The base 70 defines a through hole 71 extending through a top and a bottom of the base 70 and communicating with the through slot 35. The supporting pole 30 radially defines three connection holes 31 arranged along the lengthwise direction of the supporting pole 30 and communicating with the through slot 35.

Each conductive apparatus 50 includes a barrel-shaped shell 51 fitted about the supporting pole 30, an annular tank 52 fitted about the supporting pole 30 and latched in the shell 51, conductive liquid 53 received in the tank 52, an insulating oil layer 55 on a top surface of the conductive liquid 53 for preventing volatization of the conductive liquid 53, an annular cover 56 rotatably fitted about the supporting pole 30 and covering the tank 52, three first cables 60, a second cable 82, and a conductive liquid test assembly 57. A top of the tank 52 defines an annular slide slot 521 surrounding the supporting pole 30. The tank 52 is made of insulating material, such as plastic. One of the connection holes 31 of the supporting pole 30 is located at a lower portion of the tank 52. The cover 56 is rotatably covered on the slide slot 521 of the tank 52. The cover 56 defines three insertion holes 562 communicating with the slide slot 521 of the tank 52, for inserting the first cables 60. In the embodiment, the conductive liquid 53 is mercury.

The conductive liquid test assembly 57 includes an L-shaped hyaline interconnecting pipe 571, two opposite positioning poles 573 extending out from an upper portion of the shell 51, a light transmitter 575 mounted on a distal end of one of the positioning poles 573, a light sensor 576 mounted on a distal end of the other positioning pole 573, an alarm 577, and a cable 578 electrically coupled between the light sensor 576 and the alarm 577. The alarm 577 includes three lamps 579 for indicating the operation states of the conductive liquid test assemblies 57.

The interconnecting pipe 571 includes a first part 572 extending through lower portions of the shell 51 and the corresponding tank 52, and a second part 574 perpendicularly extending up from a distal end of the first part 572. The interconnecting pipe 571 communicates with the tank 52, and the conductive liquid 53 flows into the interconnecting pipe 571. A height of the conductive liquid 53 in the tank 52 equals a height of the conductive liquid 53 in the interconnecting pipe 571. The second part 574 of the interconnecting pipe 571 is mounted between the positioning poles 573, and an upper portion of the second part 574 is located between the light transmitter 575 and the light sensor 576.

The light transmitter 575 and the light sensor 576 of each conductive liquid test assembly 57 are used for testing whether the height of the conductive liquid 53 has reached a certain level or not. The light transmitter 575 emits light. If the light sensor 576 cannot receive the light, it means that the light is shielded by the conductive liquid 53 received in the second part 574 of the interconnecting pipe 571, thus the height of the conductive liquid 53 in the tank 52 is sufficient, and the corresponding lamp 579 of the alarm 557 lights. If the light sensor 576 can receive the light, and the corresponding lamp 579 of the alarm 557 does not light, it means that the light is not blocked by the conductive liquid 53 received in the second part 574 of the interconnecting pipe 571, thus the height of the conductive liquid 53 in the tank 52 is not at the correct level, and more conductive liquid 53 is needed to be added in the tank 52.

A first end of each first cable 60 is extended through the insertion hole 562 of the cover 56 and the insulating oil layer 55, and is inserted into and electrically connected to the conductive liquid 53. A second end of each first cable 60 is electrically coupled to the power socket 15. A middle of the first cable 60 is positioned to the hook 161 of the bracket 16.

First ends of the second cables 82 are extended through the through hole 71 of the base 70, the through slot 35 of the supporting pole 30, the connection holes 31 of the supporting pole 30, and the tanks 52, to be electrically coupled to the conductive liquid 53. Second ends of the second cables 82 are electrically coupled to an uninterrupted power supply (UPS) 80. In the embodiment, the second ends of the second cables 82 are respectively coupled to a live wire, a neutral wire, and a ground wire of the UPS 80.

In use, the power of the UPS 80 is conducted to the power sockets 15 by the second cables 82 coupled to the conductive liquid 53 and the first cables 60 coupled between the conductive liquid 53 and the power sockets 15, to supply power for the electronic device under test. When the supporting member 10 rotates, all of the brackets 16, the first cables 60, and the covers 56, rotate with the supporting member 10 and the wheels 11 can roll freely along the slide rail 20.

In another embodiment, an altitude scale or other indicator is marked on an outer surface of the second part 574 of each interconnecting pipe 571, to indicate the height of the conductive liquid.

It is to be understood, that even though numerous characteristics and advantages of the embodiment have been set forth in the foregoing description, together with details of the structure and function of the embodiment, the disclosure is illustrative only, and changes may be made in detail, especially in the matters of shape, size, and arrangement of parts within the principles of the present disclosure to the full extent indicated by the broad general meaning of the terms in which the appended claims are expressed.

What is claimed is:

1. A test platform, comprising:
   a base;
   a supporting pole extending up from the base;
   a supporting member rotatably supported on a top end of the supporting pole, and comprising a power socket mounted on the supporting member; and
   a plurality of conductive apparatus mounted to the supporting pole, and each conductive apparatus comprising a tank fitted about the supporting pole, conductive liquid received in the tank, a first cable, and a second cable;
   wherein each tank defines an annular slide slot surrounding the supporting pole, first ends of the first cables are connected to the power socket, second ends of the first cables extend through the slide slots and are electrically coupled to the conductive liquid, a first end of the second cable is electrically coupled to the conductive liquid, and a second end of the second cable is electrically coupled to an uninterrupted power supply.

2. The test platform of claim 1, wherein the supporting pole is hollow, the supporting pole axially defines a through slot, the first ends of the second cables are extended through the through slot, the first ends of the second cable extends through the supporting pole and is inserted into the tank.

3. The test platform of claim 2, wherein the supporting pole radially defines a plurality of connection holes communicating with the through slot of the supporting pole, the first end of the second cable extends through the corresponding connection hole and is coupled to the conductive liquid.

4. The test platform of claim 2, wherein the base defines a through hole communicating with the through slot of the supporting pole, the second cables extend through the through hole of the base.

5. The test platform of claim 1, wherein each conductive apparatus further comprises a cover rotatably fitted about the supporting pole, the cover covers the slide slot, and the second ends of the first cables extend through the cover and are electrically coupled to the conductive liquid.

6. The test platform of claim 5, wherein the cover is annular, and defines a plurality of insertion holes communicating with the slide slot.

7. The test platform of claim 1, wherein each conductive apparatus further comprises a shell fitted about the supporting pole, the tank is latched in the shell.

8. The test platform of claim 1, wherein each conductive apparatus further comprises an insulating oil layer shielding on a top surface of the conductive liquid for avoiding the conductive liquid volatilizing.

9. The test platform of claim 1, wherein each conductive apparatus further comprises a conductive liquid test assembly, the conductive liquid test assembly comprises an interconnecting pipe communicating with a lower portion of the tank, a light transmitter located at a side of the interconnecting pipe, a light sensor located at an opposite side of the interconnecting pipe, and an alarm electrically coupled to the light sensor, the light transmitter emits light, wherein if the light sensor cannot receive the light, it means the light is shielded by the conductive liquid received in the interconnecting pipe, the alarm gives an indication; if the light sensor can receive the light, it means the light is not shielded by the conductive liquid received in the interconnecting pipe, the alarm gives a contrary indication.

10. The test platform of claim 9, wherein the interconnecting pipe comprises a first part extending through the lower portion of the tank, and a second part extending up from a distal end of the first part, an upper portion of the second part is located between the light sensor and the light transmitter.

11. The test platform of claim 9, wherein the interconnecting pipe is made of insulating material.

12. The test platform of claim 1, wherein the conductive liquid is hydrargyrum.

13. The test platform of claim 1, wherein the tank is made of insulating material.

14. The test platform of claim 1, wherein the supporting member further comprises a bracket extending down from the supporting member for positioning the first cables.

15. The test platform of claim 14, wherein the bracket comprises a plurality of hooks for positioning middles of the first cables.

* * * * *